(12) United States Patent
Wilmoth (10) Patent No.: US 10,991,404 B1
(45) Date of Patent: Apr. 27, 2021

(54) LOOPBACK STROBE FOR A MEMORY SYSTEM

(71) Applicant: Micron Technology, Inc., Boise, ID (US)

(72) Inventor: David D. Wilmoth, Fairview, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/793,979

(22) Filed: Feb. 18, 2020

(51) Int. Cl.
*G11C 7/22* (2006.01)
*G11C 7/10* (2006.01)
*G11C 11/4076* (2006.01)

(52) U.S. Cl.
CPC ............ *G11C 7/222* (2013.01); *G11C 7/1066* (2013.01); *G11C 7/1093* (2013.01); *G11C 11/4076* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 9,984,740 B1* | 5/2018 | Hiraishi | G11C 7/222 |
| 2012/0170593 A1* | 7/2012 | Oh | G11C 7/1093 370/464 |
| 2016/0180898 A1* | 6/2016 | Hwang | G11C 7/1087 711/103 |
| 2017/0062029 A1* | 3/2017 | Song | G06F 13/4068 |
| 2019/0064265 A1* | 2/2019 | Wilmoth | G11C 7/1015 |
| 2019/0079699 A1* | 3/2019 | Lee | G06F 3/0656 |

* cited by examiner

*Primary Examiner* — Tan T. Nguyen
(74) *Attorney, Agent, or Firm* — Fletcher Yoder, P.C.

(57) ABSTRACT

Devices and methods include transmitting loopback signals for monitoring operation of a plurality of memory devices. In some embodiments, a first memory device may transmit a loopback strobe signal based at least in part on a strobe signal for the first memory device. In certain embodiments, a frequency of the loopback strobe signal is a fraction of the frequency of the strobe signal. In some embodiments, the first memory device may transmit a loopback data signal based at least in part on the strobe signal, wherein a frequency of the loopback strobe signal is the fraction of the frequency of the strobe signal.

20 Claims, 6 Drawing Sheets

LOOPBACK STROBE FOR A MEMORY SYSTEM

BACKGROUND

Field of the Present Disclosure

Embodiments of the present disclosure relate generally to memory devices. More specifically, embodiments of the present disclosure relate to monitoring operation of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device implemented on dual in-line memory module (DIMM). In this manner, the processor may communicate with the memory device, for example, to retrieve executable instructions, retrieve data to be processed by the processor, and/or store data output from the processor.

To facilitate improving operational reliability, operation of a memory device may be monitored, for example, by a host controller to facilitate debugging operations of the memory device and/or to facilitate performing diagnostics on operation of the memory device. In some instances, operation of a memory device may be monitored based on an analysis of signals indicative of data input to and/or output from the memory device. In other words, accuracy of operational monitoring may be affected by integrity of such signals returned from the memory device.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

To facilitate monitoring operation of memory, the present disclosure provides techniques for implementing a loopback datapath (e.g., network) between one or more memory devices and/or host devices (e.g., host processors), which enables transmission of a loopback signal indicative of memory device operation. In some embodiments, a memory device may generate a loopback data signal and loopback strobe signal based at least in part on a data (e.g., DQ) signal and/or a strobe (e.g., DQS) signal output, for example, to the processor. As operating frequencies continue to increase to facilitate providing increased data transfer speeds, in some embodiments, a memory device may generate a loopback strobe signal with a lower frequency compared to a corresponding strobe signal, for example, by sampling every fourth bit using a loopback strobe signal that has one-fourth the frequency of a corresponding strobe signal. A host controller may monitor (e.g., debug and/or diagnose) operation of the target memory device through the slower loopback signal (e.g., as opposed to the higher frequency data signal) transmitted between the memory device and the host controller via a loopback datapath. In some instances, the host controller is included in and/or replaced by test or characterization equipment used to verify operation or to verify performance of the targeted memory device. For example, the testing may be performed during manufacturing and prior to installation of the targeted memory device in a computing system and/or on a memory module. Additionally or alternatively, the testing may be used for debug purposes in case of a system/device underperforming expectations.

A loopback datapath may be implemented to connect multiple memory devices, for example, with a loopback pin on a memory module communicatively coupled to the host controller. However, transmitting a loopback signal through multiple memory devices may introduce distortion on the loopback signal, for example, due to process variations, voltage variations, and/or temperature variations. In fact, such variations may cause loopback signal distortion due to the inherent nature of components within a memory device. Furthermore, in some instances, the time the loopback signal takes to transition from a logical high to a logical low may differ from the time the loopback signal takes to transition from a logical low to a logical high. When connected in series, such timing differences may propagate through multiple memory devices. For example, such timing differences may result in a slow edge of a received loopback signal driving a slow edge of a generated loopback signal, thereby stacking the effect of the timing differences. At least in some instances, distortion may affect signal integrity of the loopback signal and, thus, affect memory diagnostics and/or debugging performed based on the loopback signal.

Thus, to facilitate improving memory diagnostics and/or debugging, the present disclosure provides techniques to facilitate improving loopback signal integrity, for example, by implementing a loopback strobe signal with a lower frequency compared to a corresponding strobe signal, for example, by sampling every fourth bit using a loopback strobe signal that has one-fourth the frequency of a corresponding strobe signal.

Figure 1:
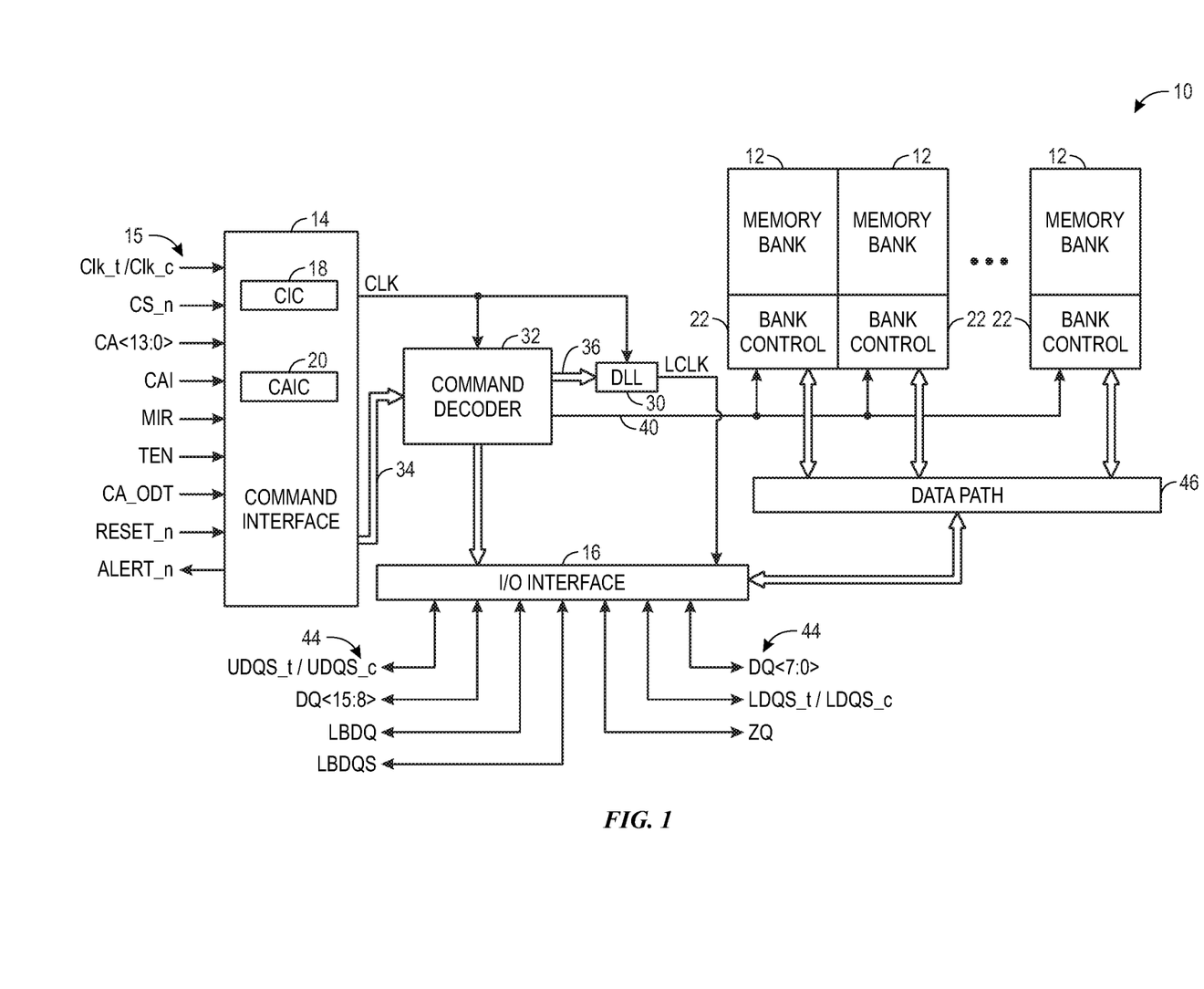
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/ crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n)

may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the TO signals may be divided into upper and lower bytes. For instance, for a ×16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_b), the DQS signals may be provided as a differential pair of data strobe signals (DQS_t/ and DQS_b) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_b; LDQS_t/ and LDQS_b) corresponding to upper and lower bytes of data sent to and from the memory device 10, for instance.

An impedance (ZQ) calibration signal may also be provided to the memory device 10 through the TO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicate of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
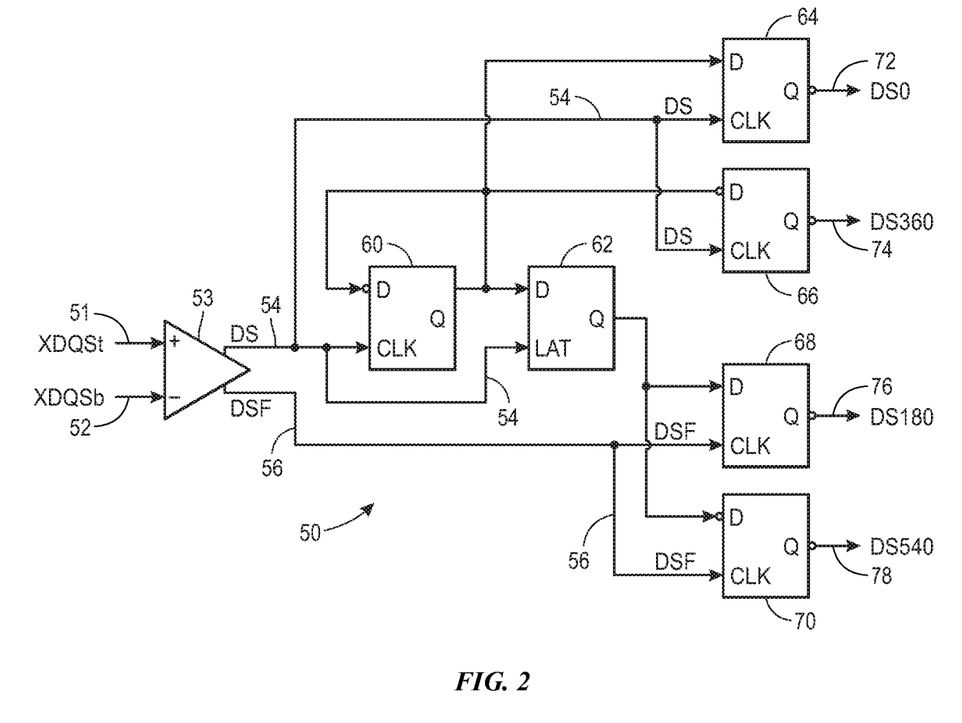
FIG. 2 is a schematic view of multi-phase generation circuitry used to receive a data strobe for a write command and to divide the data strobe into multiple phases, according to an embodiment of the present disclosure.

FIG. 2 illustrates a multi-phase generation circuitry 50 that may be implemented in the 10 interface 16. The multi-phase generation circuitry 50 receives an external DQS (XDQSt) signal 51 (e.g., UDQS_t) that runs at the same speed as the clock and may be turned on or off. In some embodiments, as discussed previously, the external DQS signal 51 may be accompanied by an external bar DQS (XDQSb) signal 52 that is complementary to the external DQS signal 51. These signals may be transmitted to an amplifier 53 to provide an internal DS signal 54 and/or a complementary internal DS false signal 56. The amplifier 53 changes the power of the external DQS signal 51 from an external level to a level appropriate for use in the memory device 10.

As illustrated, the multi-phase generation circuitry 50 uses the internal DS signal 54 and/or the internal DS false signal 56 to divide the signal out using a toggle flip-flop 60 that toggles its output each time a pulse occurs on the internal DS signal 54. The multi-phase generation circuitry 50 also includes a latch 62 that latches the output from the toggle flip-flop 60 to track falling edges of the internal DS signal 54. In other words, the toggle flip-flop 60 sets a rising mode that causes changes of states in rising edge flip-flops 64 and/or 66 on rising edges of the internal DS signal 54. Moreover, the toggle flip-flop 60 and the latch 62 work together to set a falling mode that causes changes of state in falling edge flip-flops 68 and/or 70 during a falling edge of the internal DS signal 54.

DSO 72 corresponds to an output of the rising edge flip-flop 64. DSO 72 transitions high with every other rise of the external DQS signal 51. DS360 74 corresponds to a rising edge flip-flop 66. DS360 74 transitions high on rising edges of the external DQS signal 51 between those causing DSO 72 to go high. In other words, rising edges of the external DQS signal 51 alternate between causing DSO 72 and DS360 to go high.

DS180 76 corresponds to an output of the falling edge flip-flop 68. Due to the use of the internal DS false signal 56, DS180 76 transitions high with every other falling edge of the external DQS signal 51. Similarly, DS540 78 corresponds to an output of the falling edge flip-flop 70 and transitions high with the other alternating falling edges of the external DQS signal 51. In other words, single-edges of signals DSO 72, DS360 74, DS180 76, and DS540 78 each would cause toggles at a frequency of one-fourth of the double data rate of the external DQS signal 51. Additionally or alternatively, the frequency may be further divided to provide different frequencies relative to the internal DS signal 54. For example, additional flip-flops may be included to divide the DSO 72, DS360 74, DS180 76, and DS540 78 to each be one-quarter of the frequency of the internal DS signal 54.

Figure 3:
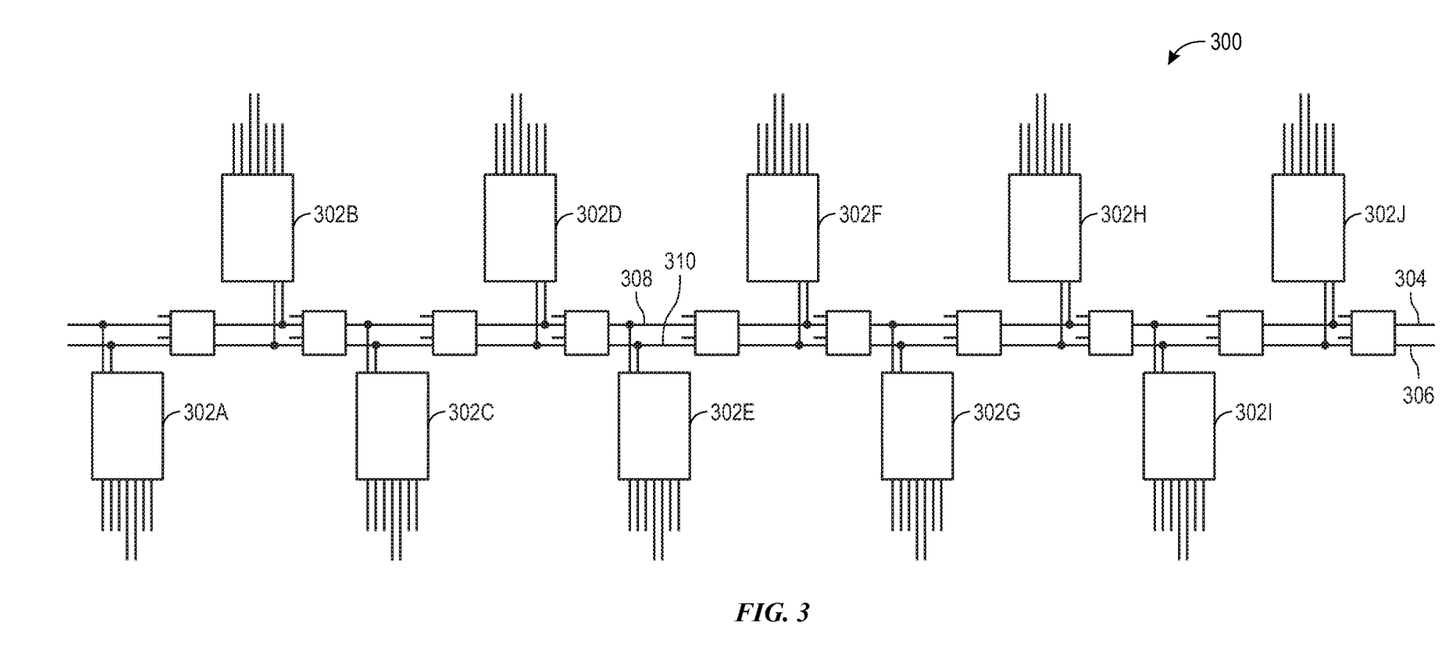
FIG. 3 is a block diagram of a memory system having any number of memory devices, according to an embodiment of the present disclosure.

FIG. 3 is a block diagram of a memory system 300 having a board including any number of memory devices, such as ten memory devices 302A, 302B, 302C, 302D, 302E, 302F, 302G, 302H, 302I, and 302J (collectively referred to as memory devices 302) coupled in series by first trace 308 and second trace 310. The memory devices 302 may be coupled to the board by traces 308, 310. As illustrated, the memory system 300 includes the memory devices 302 with a common loopback strobe signal 304 on first trace 308 and a common loopback data signal 306 on second trace 310. In some embodiments, each of the memory devices 302 may be a DRAM device (e.g., DDR4 and/or DDR5 device). The common loopback strobe signal 304 may have one-fourth the frequency of a corresponding strobe signal. For example, the memory device 302A may generate the common loopback strobe signal 304 from a strobe signal (e.g., DSO 72) at a fraction (e.g., one-fourth) of the frequency of the strobe signal.

Transmitting the loopback strobe signal and the loopback data signal through the LBDS line (e.g., first trace 308) and LBDQS line (e.g., second trace 310), respectively, may introduce distortion into the common loopback strobe signal 304 and/or common loopback data signal 306. For example, each additional device, such as memory devices 302B, 302C, 302D, 302E, 302F, 302G, 302H, 302I, and 302J, connected to LBDS line and LBDQS line may introduce additional impedance on the lines. Additionally or alternatively, the LBDS and LBDQS lines may include inherent impedance values that increase based on the length of the lines. In other words, as the number of connected devices and/or the length of the signal lines increases, the loopback signals passing through the lines may suffer increased degradation. Due to the passage through the LBDS and LBDQS lines, the common loopback strobe signal 304 and common loopback data signal 306 may degrade.

Figure 4:
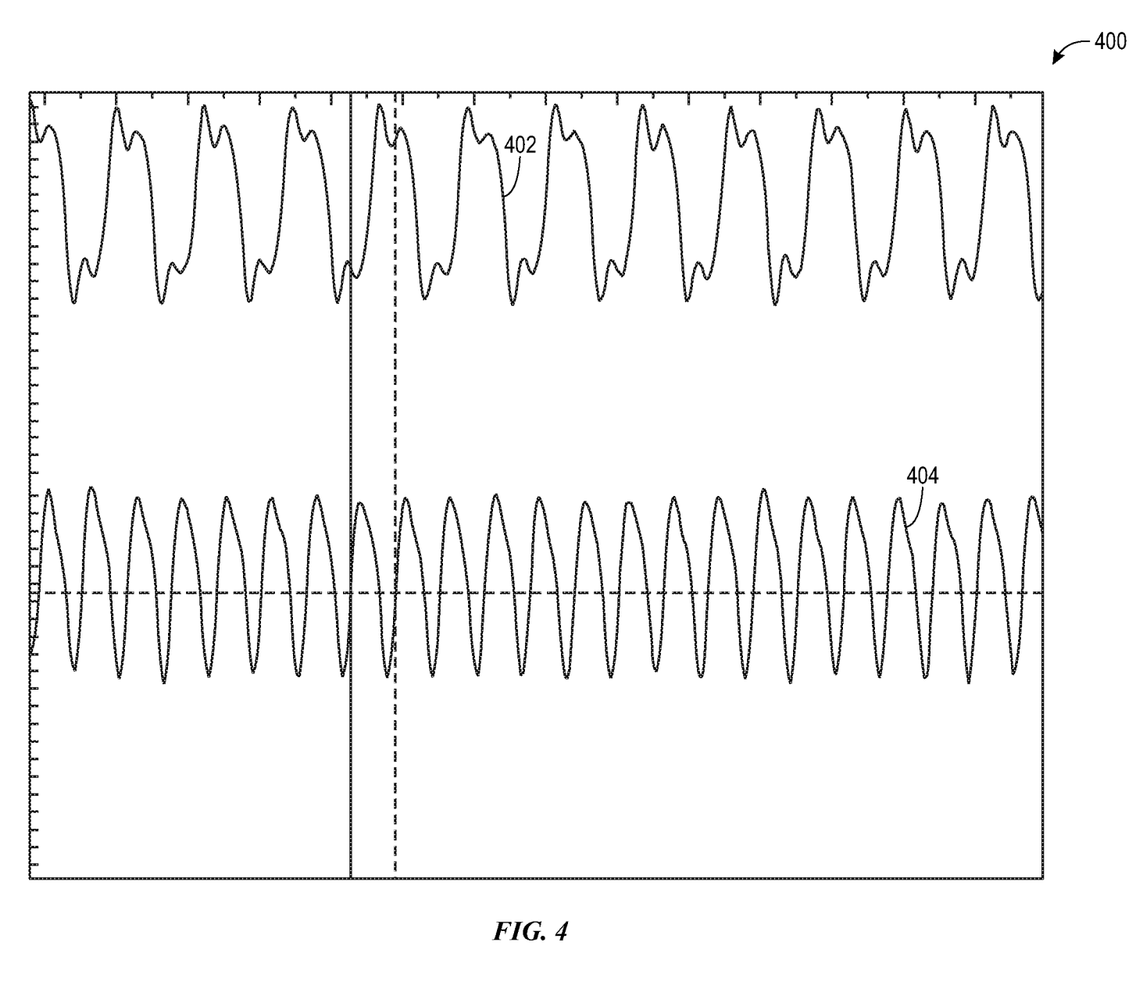
FIG. 4 is a timing diagram of a loopback data signal and a loopback strobe signal, the loopback strobe signal having half the frequency of a corresponding strobe signal, according to an embodiment of the present disclosure.

FIG. 4 is a signal results graph 400 of an output loopback data signal 402 and an output loopback strobe signal 404 that both started with square waves having duty cycles of 50%. As illustrated, the output loopback strobe signal 404 may have a frequency that is twice the frequency of the output loopback data signal 402. In some embodiments, the output loopback data signal 402 may be a fourth of a system frequency (e.g., a frequency of the internal DS signal 54). The signal results graph 400 shows the loopback signal output that occurred after transmission through a number (e.g., 10) of memory devices 302. Here, both the output loopback data signal 402 and the output loopback strobe signal 404 have degraded. Specifically, the shape of the output loopback strobe signal 404 has degraded more than the output loopback data signal 402. For instance, the general shape of the output loopback strobe signal 404 has degraded more from the original shape. Additionally, the duty cycle of the output loopback strobe signal 404 has degraded more than the duty cycle of the output loopback data signal 402. For instance, the output loopback data signal 402 may have a duty cycle of a first level (e.g., 51% from 50%) showing a first level of degradation while the output loopback strobe signal 404 may have a duty cycle of a second level (e.g., 64% from 50%) corresponding to a second and higher level of degradation. As discussed above, timing differences in transitioning between logical highs to logical lows between the LBDQS and the LBDS signals due to degradation in at least one of the loopback signals propagate through any number of memory devices. As the system frequency (e.g., the frequency of the internal DS signal 54) increases, the degradation of the loopback signals may also increase. As the degradation of the loopback signal increases, eventually the loopback signal becomes too degraded to be recognized by a receiver of the output loopback signal. In other words, as the system frequency increases, eventually the loopback signal becomes too degraded and the loopback datapath fails to monitor operation of the memory device 10.

Figure 5:
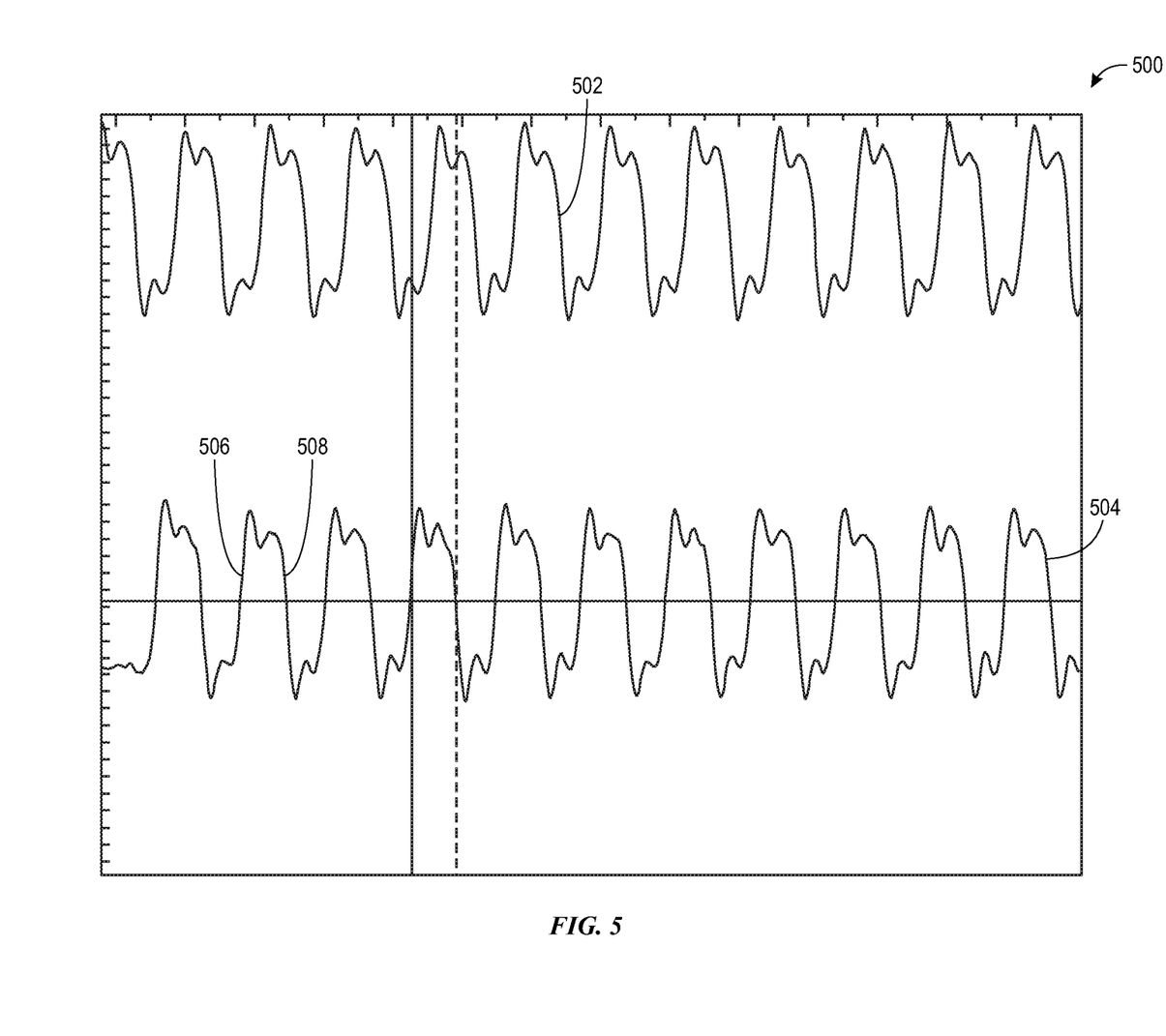
FIG. 5 is a timing diagram of a loopback data signal and a loopback strobe signal, the loopback strobe signal having one fourth the frequency of a corresponding strobe signal, according to an embodiment of the present disclosure.

To compensate for such degradation of the output loopback strobe signal 404, the memory device 10 may use the output loopback strobe signal 404 at a lower frequency. For instance, a slower clock may be used, but the output loopback strobe signal 404 may be defined as a double data rate signal enabling more frequent switching of the LBDQS with reduced degradation of LBDQS even at functional frequencies above those possible with a single data rate on the LBDQS. FIG. 5 is a signal results graph 500 of an output loopback data signal 502 and an output loopback strobe signal 504 that both started with square waves having duty cycles of 50%. As illustrated, the output loopback strobe signal 504 may have a frequency that is equal to the frequency of the output loopback data signal 502. In some embodiments, the output loopback data signal 502 may be a fourth of a system frequency (e.g., a frequency of the internal DS signal 54). The signal results graph 500 shows the loopback signal output that occurred after transmission through a number (e.g., 10) of memory devices 302. Here, both the output loopback data signal 502 and the output loopback strobe signal 504 have degraded. Specifically, the shape of both the output loopback data signal 502 and the output loopback strobe signal 504 have degraded in a similar manner. For instance, the general shapes of both the output loopback data signal 502 and the output loopback strobe signal 504 have degraded similarly into similar shapes from the original shape. Additionally, the output loopback strobe signal 504 has degraded less than the output loopback strobe signal 404. Specifically, the shape of the output loopback strobe signal 504 has degraded less than the output loopback strobe signal 404. For instance, the general shape of the output loopback strobe signal 504 has degraded less from the original shape more closely resembling the original shape. Furthermore, both the duty cycle of the output loopback data signal 502 and the duty cycle of the output loopback strobe signal 504 have degraded similarly. For instance, the output loopback data signal 502 may have a duty cycle of a first level (e.g., 51% from 50%) showing a first level of degradation while the output loopback strobe signal 504 may have a duty cycle of a second level (e.g., 51% from 50%) showing a second level of degradation similar to the first level of degradation. Additionally, the duty cycle of the output loopback strobe signal 504 has degraded less than the duty cycle of the output loopback strobe signal 404. Further, as illustrated, the output loopback strobe signal 504 may be used to capture the output loopback data signal 502 using a double data rate. For instance, a single cycle of the output loopback strobe signal 504 may include a rising edge 506 and a falling edge 508 that capture different parts of a single cycle of the output loopback data signal 502. This enables the output loopback strobe signal 504 to have the same frequency as the output loopback data signal 502 while satisfying the Nyquist sampling criterion.

Figure 6:
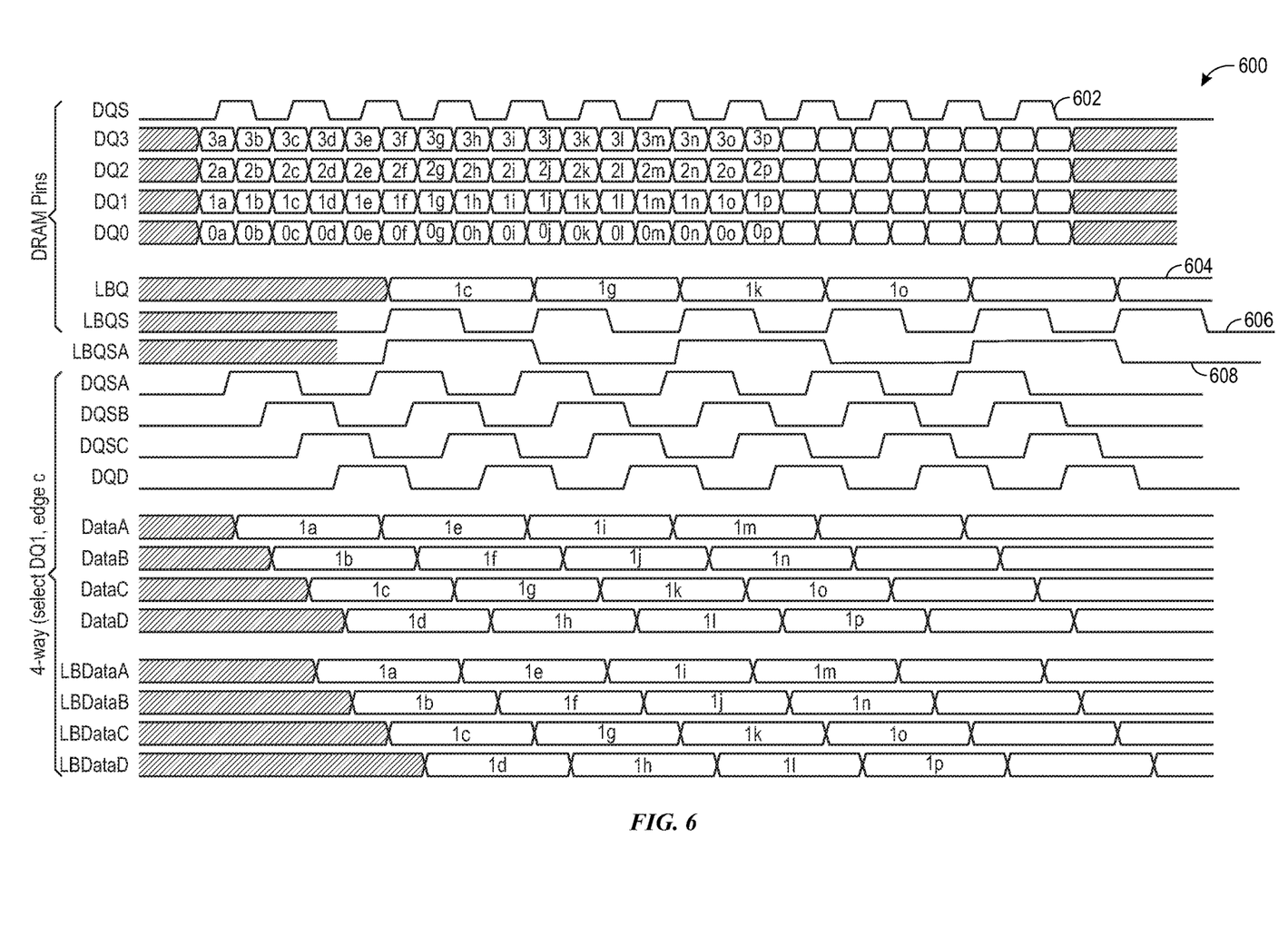
FIG. 6 is a timing diagram of a strobe signal, data signals, loopback data signals, and loopback strobe signals in the memory device of FIG. 3, according to an embodiment of the present disclosure.

To help illustrate, a timing diagram 600, which includes signal waveforms present in the memory device 10, is shown in FIG. 6. As depicted, the timing diagram 600 describes a strobe signal 602, a loopback data signal 604, a first loopback strobe signal 606, a second loopback strobe signal 608, and data signals (DQ0, DQ1, DQ2, and DQ3). The memory device 10 may generate one or more loopback strobe signals based at least in part on the strobe signal 602, for example, by down sampling and/or phase shifting the strobe signal 602 to facilitate reading a corresponding loopback data signal (e.g., loopback data signal 604). In certain embodiments, the memory device 10 may generate one or more loopback strobe signals similar to second loopback strobe signal 608. Additionally or alternatively, the memory device 10 may generate one or more loopback strobe signals similar to first loopback strobe signal 606. Additionally or alternatively, the memory device 10 may generate a second loopback strobe signal 608 such that an (e.g., falling) edge is aligned (e.g., edge-aligned) with the corresponding loopback data signal 604. To help illustrate, in the depicted example, the memory device 10 down samples the strobe signal 602 by a factor of four to generate the second loopback strobe signal 608 corresponding with the loopback data signal 604. As such, the second loopback strobe signal 608 has a frequency of one-fourth of the frequency of the strobe signal 602. Likewise, the loopback data signal 604 has a frequency of one-fourth the frequency of the strobe signal 602. The lower frequency of the loopback signals reduces degradation and allows for frequencies above those possible for a single data rate on the LBDQS. In some embodiments, the loopback data signal 604 and the second loopback strobe signal 608 may have a same frequency as each other but a lower frequency than a system frequency of the memory device 10 other than one-fourth of the system frequency of the strobe signal 602 (e.g., one-half, one-eighth, etc.).

Thus, the technical effects of the present disclosure include facilitating improved monitoring of memory device operations, for example, by improving signal integrity of a loopback signal indicative of memory device operation. The method describes a loopback strobe signal having a frequency one fourth of a strobe signal frequency.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory system comprising:
a plurality of memory devices coupled in series, wherein the plurality of memory devices comprises:
a first memory device configured to:
transmit a loopback strobe signal based at least in part on a strobe signal for the first memory device, wherein a frequency of the loopback strobe signal is a fraction of the frequency of the strobe signal; and
transmit a loopback data signal based at least in part on the strobe signal, wherein a frequency of the loopback data signal is the fraction of the frequency of the strobe signal.

2. The memory system of claim 1, wherein the frequency of the loopback strobe signal is a fraction of a frequency of a system clock used to generate the strobe signal.

3. The memory system of claim 2, wherein the frequency of the loopback strobe signal is one-fourth of the frequency of the system clock.

4. The memory system of claim 1, wherein the frequency of the loopback strobe signal is one-fourth of the frequency of the strobe signal.

5. The memory system of claim 1, further comprising a phase generation circuitry configured to generate the loopback strobe signal from the strobe signal received from a host device.

6. The memory system of claim 5, wherein the phase generation circuitry is configured to generate the loopback data signal from the strobe signal received from the host device.

7. The memory system of claim 6, wherein the frequency of the loopback data signal is one-fourth of the frequency of the strobe signal.

8. The memory system of claim 1, wherein the loopback strobe signal is defined as a double data rate signal.

9. The memory system of claim 1, comprising a board to which the first memory device is coupled, wherein the first memory device comprises a dynamic random access memory (DRAM) device.

10. A method for operating a memory system to facilitate monitoring operation of memory devices implemented on the memory system, comprising:
transmitting, at a first memory device of the memory system, a loopback strobe signal based at least in part on a strobe signal for the first memory device, wherein a frequency of the loopback strobe signal is a fraction of the frequency of the strobe signal; and
transmitting, at the first memory device, a loopback data signal based at least in part on the strobe signal, wherein a frequency of the loopback data signal is the fraction of the frequency of the strobe signal.

11. The method of claim 10, wherein the frequency of the loopback strobe signal is a fraction of a frequency of a system clock used to generate the strobe signal.

12. The method of claim 11, wherein the frequency of the loopback strobe signal is one-fourth of the frequency of the system clock.

13. The method of claim 10, wherein the frequency of the loopback strobe signal is one-fourth of the frequency of the strobe signal.

14. The method of claim 10, further comprising generating, at a phase generation circuitry, the loopback strobe signal from the strobe signal received from a host device.

15. The method of claim 14, further comprising generating, at the phase generation circuitry, the loopback data signal from the strobe signal received from the host device.

16. The method of claim 15, wherein the frequency of the loopback data signal is one-fourth of the frequency of the strobe signal.

17. A method, comprising:
 receiving, at a first memory device, a strobe signal from a host device;
 generating a loopback strobe signal based at least in part on the strobe signal for the first memory device, wherein a frequency of the loopback strobe signal is a fraction of the frequency of the strobe signal;
 generating a loopback data signal based at least in part on the strobe signal, wherein a frequency of the loopback data signal is the fraction of the frequency of the strobe signal; and
 transmitting the loopback data signal and the loopback strobe signal to enable the host device to tune operation of a memory system comprising the first memory device.

18. The method of claim 17, wherein the frequency of the loopback strobe signal is a fraction of a frequency of a system clock used to generate the strobe signal.

19. The method of claim 18, wherein the frequency of the loopback strobe signal is one-fourth of the frequency of the system clock.

20. The method of claim 19, wherein the frequency of the loopback strobe signal is one-fourth of the frequency of the strobe signal.

\* \* \* \* \*